(12) United States Patent
Devgan et al.

(10) Patent No.: US 8,824,901 B2
(45) Date of Patent: Sep. 2, 2014

(54) MULTI-MODE OPTOELECTRONIC OSCILLATOR

(75) Inventors: Preetpaul S Devgan, Laurel, MD (US); Vincent J Urick, Alexandria, VA (US); Keith J Williams, Dunkirk, MD (US)

(73) Assignee: The United States of America, as represented by the Secretary of the Navy, Washington, DC (US)

( * ) Notice: Subject to any disclaimer, the term of this patent is extended or adjusted under 35 U.S.C. 154(b) by 249 days.

(21) Appl. No.: 13/617,144

(22) Filed: Sep. 14, 2012

(65) Prior Publication Data

US 2013/0256514 A1 Oct. 3, 2013

Related U.S. Application Data

(60) Provisional application No. 61/617,251, filed on Mar. 29, 2012.

(51) Int. Cl.
*H03B 17/00* (2006.01)
*G02F 1/01* (2006.01)
*H03C 7/00* (2006.01)

(52) U.S. Cl.
CPC .............. *G02F 1/0102* (2013.01); *H03B 17/00* (2013.01); *H04B 2210/006* (2013.01); *H03C 7/00* (2013.01)
USPC ......................... 398/198; 398/195; 250/214 A (58) Field of Classification Search
USPC ....... 398/195, 196, 198, 115, 183; 250/214 A
See application file for complete search history.

(56) References Cited

U.S. PATENT DOCUMENTS 7,079,780 B1 * 7/2006 Rollins ........................... 398/198
7,359,580 B2 * 4/2008 Darcie et al. ...................... 385/3
8,224,188 B2 * 7/2012 Devgan et al. ................. 398/159

OTHER PUBLICATIONS

L. V. T. Nguyen, "Microwave photonic technique for frequency measurement of simultaneous signals," *IEEE Photon. Technol. Lett.*, vol. 21, pp. 642-644 (2009).
H. Chi, X. Zou, and J. Yao, "An Approach to the Measurement of Microwave Frequency Based on Optical Power Monitoring," *IEEE Photon. Technol. Lett.*, vol. 20, pp. 1249-1251 (2008).
X. Zou, H. Chi, and J. Yao, "Microwave Frequency Measurement Based on Optical Power Monitoring using a Complementary Optical Filter Pair," *IEEE Trans. Microw. Theory Tech.*, vol. 57, pp. 505-511 (2009).
P. S. Devgan, M. W. Pruessner, V. J. Urick, and K. J. Williams, "Detecting low-power RF signals using a multimode optoelectronic oscillator and integrated optical filter," *IEEE Photon. Technol. Lett.*, vol. 22, pp. 152-154 (2010).
P. Devgan, J. Lasri, R. Tang, and P. Kumar, "Ultra-low-jitter multiwavelength synchronized optical pulse source for C-, L- and U-bands," *Electron. Lett.*, vol. 39, pp. 1337-1339 (2003).
P. S. Devgan, J. F. Diehl, V. J. Urick, C. E. Sunderman, and K. J. Williams, "Even-order harmonic cancellation for off-quadrature biased Mach-Zehnder modulator with improved RF metrics using dual wavelength inputs and dual outputs," *Opt. Expr.*, vol. 17, pp. 9028-9039 (2009).

* cited by examiner

*Primary Examiner* — Tony Ko
(74) *Attorney, Agent, or Firm* — US Naval Research Laboratory; L. George Legg (57) ABSTRACT

A multi-mode optoelectronic oscillator (MM-OEO) includes an OEO cavity having an input for receiving an RF signal and an RF output. The OEO cavity includes a) a first laser having a first laser output, a second laser having a second laser output, b) a modulator having i) a first input coupled to the first laser output, ii) a second input coupled to the second laser output, iii) a third input, iv) a first modulator output, and v) a second modulator output, c) a semiconductor optical amplifier (SOA) having an input coupled to the first modulator output and having an SOA amplified output, d) a photodetector coupled to the SOA amplified output and having an output, and e) a coupler having an input coupled to the photodetector output and having a first output coupled to the third modulator input and a second output, whereby an amplified RF signal is produced at the OEO RF output.

16 Claims, 9 Drawing Sheets

FIGURE 1

PRIOR ART

FIGURE 2

PRIOR ART

*FIGURE 3*

PRIOR ART

MULTI-MODE OPTOELECTRONIC OSCILLATOR

CROSS-REFERENCE TO RELATED APPLICATIONS

This Application claims the benefit of U.S. Provisional Application 61/617,251 filed on Mar. 29, 2012 and incorporated herein by reference.

FIELD OF THE INVENTION

The invention is directed to a method of using a two laser, multi-mode optoelectronic oscillator (OEO) for detecting unknown low power RF signals, and more particularly the invention is directed to the OEO.

BACKGROUND OF THE INVENTION

The ability to detect very low power unknown RF signals is important in applications ranging from civilian to military, e.g. as described in G. W. Anderson, D. C. Webb, A. E. Spezio, and J. N. Lee, "Advanced channelization for RF, microwave and millimeterwave applications," Proc. IEEE, vol. 79, pp. 355-388, 1991, and in J. Raza, A.-J. Boonstra, and A.-J. van der Veen, "Spatial filtering of RF interference in radio astronomy," IEEE Sig. Proc. Lett., vol. 9, pp. 64-67, 2002. Multiple methods using photonics have been proposed to detect unknown RF signals, including using dispersion, e.g. as described in L. V. T. Nguyen, "Microwave photonic technique for frequency measurement of simultaneous signals," IEEE Photon. Technol. Lett., vol. 21, pp. 642-644, 2009, power monitoring of two lasers, e.g. as described in H. Chi, X. Zou, and J. Yao, "An Approach to the Measurement of Microwave Frequency Based on Optical Power Monitoring," IEEE Photon. Technol. Lett., vol. 20, pp. 1249-1251, 2008, and narrow-band optical filters, e.g. as described in M. S. Rasras, D. M. Gill, S. S. Patel, K.-Y. Tu, Y.-K. Chen, A. E. White, A. T. S. Pomerene, D. N. Carothers, M. J. Grove, D. K. Sparacin, J. Michel, M. A. Beals, and L. C. Kimerling, "Demonstration of a Fourth-Order Pole-Zero Optical Filter Integrated Using CMOS Processes," IEEE J. Lightwave Tech., vol. 25, no. 1, pp. 87-92, 2007. Photonic systems offer the advantage of increased bandwidth, small size and immunity to electromagnetic interference. However, these methods have not focused on selectively amplifying very low power RF signals. The ability to amplify the signal while simultaneously rejecting signals at different frequencies would be advantageous to applications where a specific signal needs to be detected in a cluttered RF environment.

A previous method for channelization of an RF signal using an optoelectronic oscillator was described by V. J. Urick, P. S. Devgan, J. D. McKinney, F. Bucholtz, and K. J. Williams, "Channelisation of radio-frequency signals using optoelectronic oscillator," Electronics Letters, Vol. 45, No. 24, November 2009, pp. 1242-1244. This method used a single laser and an electronic RF amplifier which increases the noise of the system. A follow-up single laser method using no electronic RF amplifier was presented by P. S. Devgan, M. W. Pruessner, V. J. Urick, and K. J. Williams, "Detecting low-power RF signals using a multimode optoelectronic oscillator and integrated optical filter," IEEE Photonics Technology Letters, Vol. 22, No. 3, February 2010, pp. 152-154. The use of a long fiber erbium-doped fiber amplifier left this system with closely spaced cavity modes not useful for RF channelization. A system with wider spaced cavity modes and low noise is extremely useful for selectively amplifying RF signals for detection.

Figure 1:
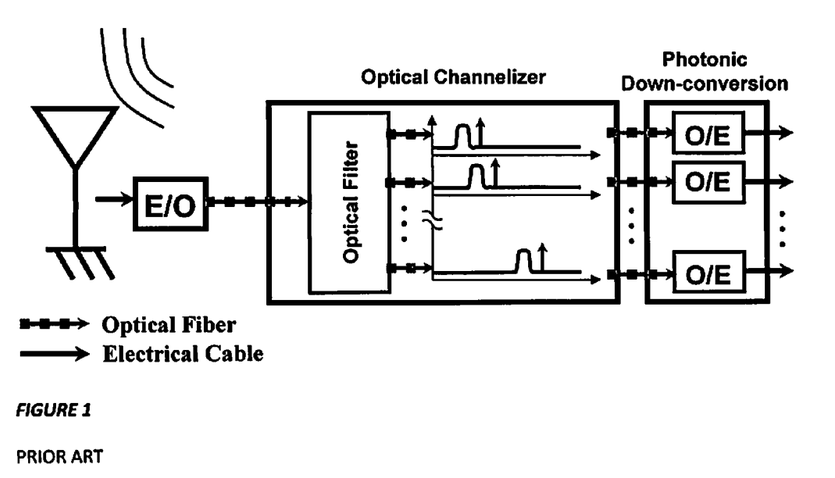
FIG. 1 is an exemplary wideband RF spectrum.
Figure 2:
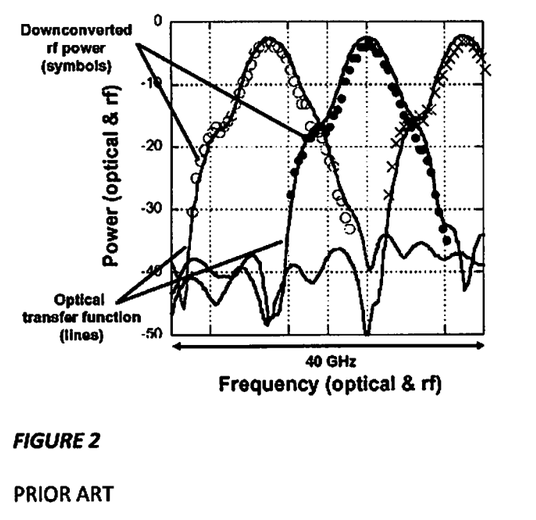
FIG. 2 is a graph of a prior art system response.
Figure 3:
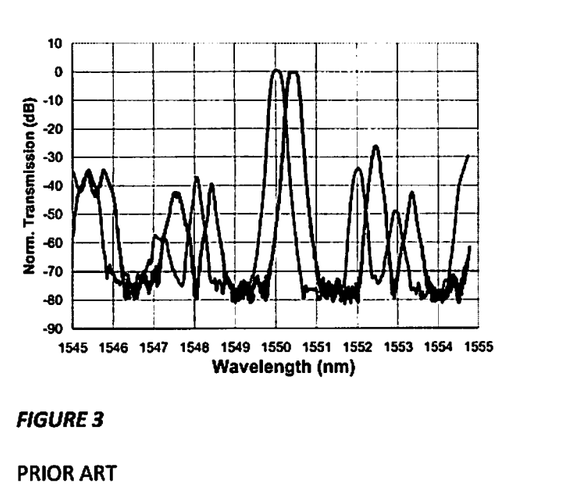
FIG. 3 is a graph of a prior art system response.

As shown in FIG. 1, a wideband RF spectrum has to be split up into smaller pieces, or channels, in order to be processed and analyzed. Optical techniques can handle the entire spectrum but cannot separate out the channels without adding loss and do not meet the narrowband requirement. FIGS. 2-3 are graphs of prior art system responses. Optical filter technology is bulky and not narrow enough. Other methods have been demonstrated but provide no selective gain.

The ability to selectively amplify low power RF signals in a cluttered RF environment is important for both civilian and military applications. While one can use a filter and amplifier, it is expensive and bulky. Photonics offer the advantage of wide bandwidths and low noise.

BRIEF SUMMARY OF THE INVENTION

According to the invention, a multi-mode OEO includes two lasers at the input and a semiconductor optical amplifier (SOA) inside the cavity for gain. a multi-mode optoelectronic oscillator (MM-OEO) includes an OEO cavity having an input for receiving an RF signal and an RF output. The OEO cavity includes a) a first laser having a first laser output, a second laser having a second laser output, b) a modulator having i) a first input coupled to the first laser output, ii) a second input coupled to the second laser output, iii) a third RF input, iv) a first modulator output, and v) a second modulator output, c) a semiconductor optical amplifier (SOA) having an input coupled to the first modulator output and having an SOA amplified output, d) a photodetector coupled to the SOA amplified output and having an output, and e) a coupler having an input coupled to the photodetector output and having a first output coupled to the third modulator input and a second output, whereby an amplified RF signal is produced at the OEO RF output.

The multi-mode optoelectronic oscillator (MM-OEO) of the invention is different from a traditional OEO in two ways: first, it does not have an internal electrical bandpass filter to select only one mode, and second, it operates below threshold when no external signal is present. An incoming RF signal whose frequency matches the free-running modes of the MM-OEO cavity will see gain while signals not matching the cavity modes will see loss. While the modes of the MM-OEO cavity can be fine tuned by the use of a fiber stretcher, they cannot change significantly. By using two lasers at different wavelengths, the MM-OEO can be made to operate with two non-overlapping sets of cavity modes.

Using one laser causes the MM-OEO to operate with one set of cavity modes, while adding the second laser switches the MM-OEO to operate at the complementary set of cavity modes. The system selectively provides gain to RF frequencies that match the cavity modes of the MM-OEO with either one or two lasers operating. The ability to switch between modes in a single system allows the OEO to detect twice as many frequencies than the prior art.

By switching between one or two lasers, the OEO cavity is sensitive to an interleaved set of frequencies. The system has an input sensitivity of −78.4 dBm, which is only 14.2 dB higher than the thermal limit (−92.6 dBm) for a 140 MHz bandwidth. In addition, mode spacing has been increased to 100 MHz, a 20 times increase over prior art systems.

Figure 4:
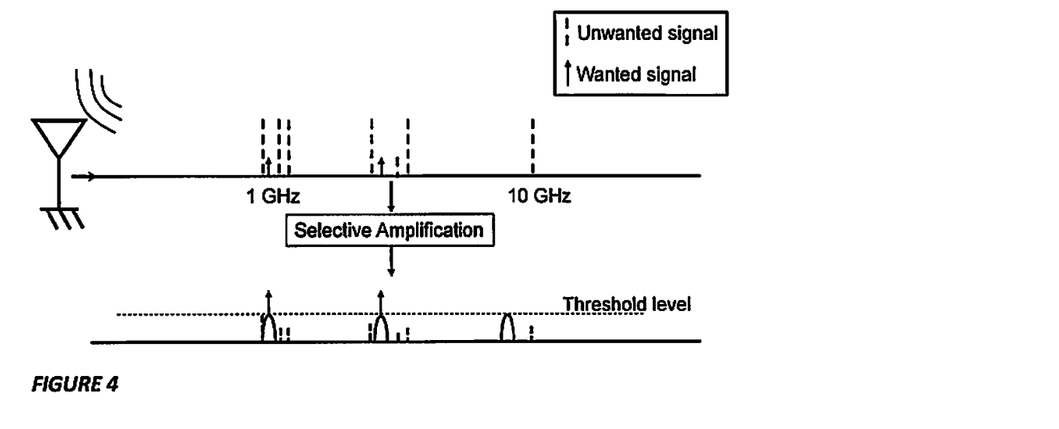
FIG. 4 is an example of a wideband RF output from an antenna in the frequency domain from 1 to 10 GHz, where after selective amplification, the weak power signals of interest are brought above a detection threshold while other stronger power signals see loss and are below the detection threshold.

The two laser OEO can selectively amplify interleaved sets of RF signals. Shown in FIG. 4 is an example of a wideband RF output from an antenna in the frequency domain from 1 to 10 GHz, where after selective amplification, the weak power signals of interest are brought above a detection threshold while other stronger power signals see loss and are below the detection threshold. With only one laser operating, the system can selectively amplify RF signals that match the cavity modes of the OEO. When both lasers are operating, the RF signals that were amplified in the one laser setup now see loss and the complementary modes provide gain to the matching RF signals. By incorporating a second laser into a dual input MZM, the system can be switched to detect twice as many signals than in the single laser case in the same OEO cavity. In fact the use of the dual input MZM guarantees the modes will remain truly interleaved over all frequency ranges, due to the $\pi$ phase difference between the two operating points on the MZM transfer curve. Any other method (e.g. additional path delay via a fiber stretcher or phase shifter) will only interleave over a given frequency band and then will no longer maintain equal spacing between modes. The system has a 25 dB extinction ratio between the peak gain on a mode and the loss between modes. While the gain bandwidth is larger than previously shown (11 MHz vs. 1 MHz), the larger increase in cavity mode spacing relative to gain bandwidth actually makes the current system more selective, which is useful for channelization applications. The invention can use a lower noise SOA to reduce the noise floor closer to the shot noise limit, as well as detecting RF signals that are not CW (pulsed, chirped, etc.)

DETAILED DESCRIPTION OF THE INVENTION

Figure 5A:
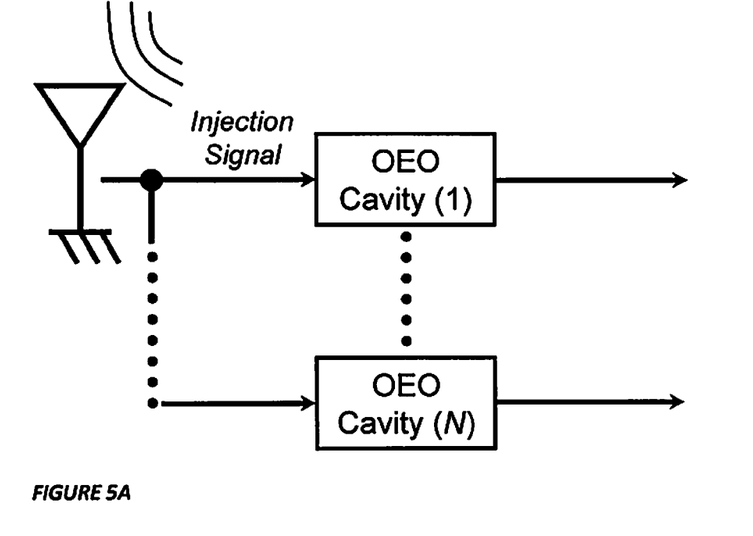
FIG. 5A is a multi-mode optoelectronic oscillator (OEO) according to the invention.
Figure 5B:
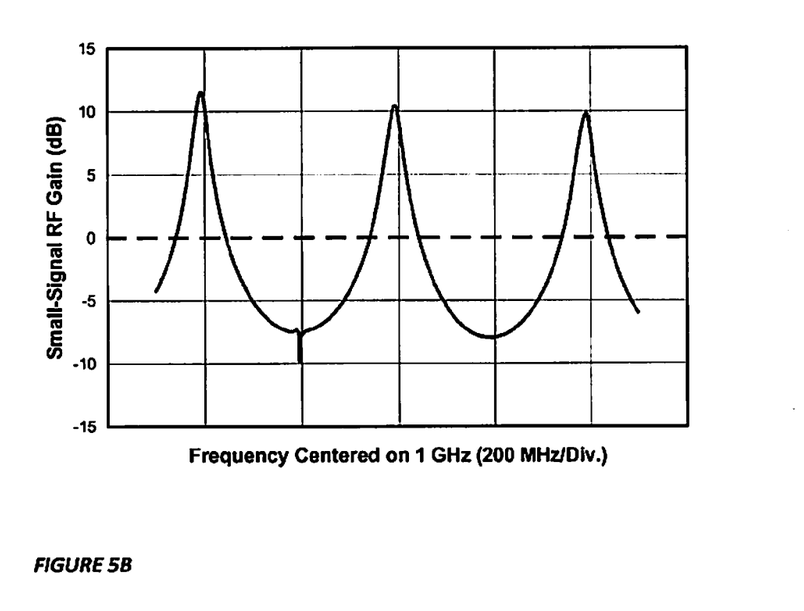
FIG. 5B is a graph of the spectrum of the OEO of FIG. 5A.

As shown in FIGS. 5A-B, the multi-mode optoelectronic oscillator (MM-OEO) 10 of the invention, below threshold, accepts an injected RF signal that forces the cavity 30 above threshold when it matches one of the cavity modes while adding loss to any signal outside the cavity modes. Optoelectronic oscillators provide exceptional bandwidth and frequency coverage. Employing the array with the modes shifted between each OEO covers a broad RF spectrum.

Figure 6A:
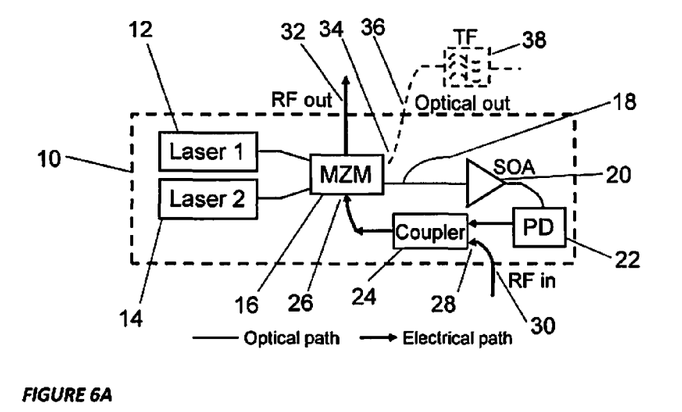
FIG. 6A shows a dual wavelength multi-mode optoelectronic oscillator (OEO) for selective amplification and detection according to the invention.

Referring now to FIG. 6A, an embodiment of an OEO 10 of the invention consists of two lasers 12 and 14 (e.g. a JDS CQF938 and/or an EM4 EM253-080) that are input to a dual-input, dual-output Mach-Zehnder modulator (MZM) 16. One example of this type of MZM is the EOSPACE AZ-2×2-NRL but other 2×2 MZMs can be used. One of the outputs 18 of the MZM is connected to an SOA (semiconductor optical amplifier) 20 and the amplified signal is sent to a photodetector 22. An exemplary SOA is a Covega BOA-6324 and an exemplary photodetector is a Discovery DSC-50S. Other photodetectors can be used to increase the frequency range of the MM-OEO. The SOA can be replaced by another optical amplifier as long as it is short enough to keep the overall OEO cavity length the same or smaller than in our example (below), while still supplying the needed optical gain. The signal is fed via a coupler 24 into the RF port 26 of the MZM 16. The other coupler port 28 is used to inject an external CW RF signal into the RF input of the OEO cavity 30. The OED's RF output 32 was connected to an electrical spectrum analyzer (ESA) to assess the performance as discussed below. The MM-OEO differs from a traditional multi-wavelength in two significant ways: first, it allows both wavelengths to enter the cavity and second, the length of fiber is minimized, separating the cavity modes as far apart in frequency as possible. By holding the intra-cavity gain just below threshold, no single mode can oscillate over the other modes, allowing the mm-OEO to remain sensitive to an external injected signal.

Figure 6B:
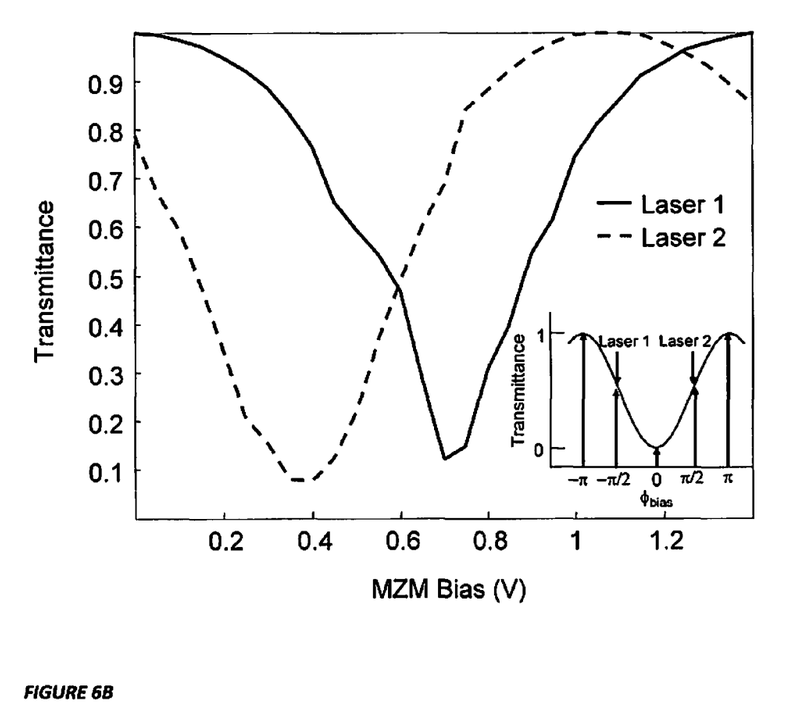
FIG. 6B is a graph showing the transmittance as a function of MZM bias for the OEO of FIG. 6A for laser 1 and laser 2, with the inset showing the phase due to bias for laser 1 and laser 2 showing a $\pi$ difference.

In order for the system to work with two lasers, we have to determine the correct wavelength setting for each laser. By using the dual input MZM, a single DC bias point can be chosen that allows one laser to operate with a $\pi$ phase shift relative to the other. To determine the operating wavelengths of the lasers, we used a fixed wavelength source for laser 1 and a wavelength tunable source for laser 2. While a tunable laser source was used for laser 2, it is not necessary and can be replaced by a fixed wavelength laser, given it matches the appropriate wavelength for the system to work. The output power of one of the outputs of the MZM can be measured as a function of the DC bias. The results for laser 1 operating at a wavelength of 1549.1 nm and laser 2 at 1528.8 nm appear in FIG. 6B. From the plot, one can see that at a bias point just less than 0.6 V, both wavelengths operate at a point where the transmittance is ~0.5, but on opposite slopes of the transfer curve. This allows for the two wavelengths to have an RF phase difference of $\pi$ as seen in the inset to FIG. 6B. When injected into the OEO cavity, the resonant modes for each wavelength will be complementary to each other. In order to switch between modes, one can simply turn off one laser and turn on the other laser. However that can leave the OEO cavity unseeded while switching between lasers. Instead, laser 1 is always operating, and laser 2 is turned on or off to switch between modes, with the power of laser 2 set to approximately twice that of laser 1. The choice of laser 1 always being on is arbitrary and laser 2 can easily be set as the laser that is always on simply by adjusting both laser 1 and laser 2's output power. We note while the operating wavelength of laser 2 is outside the gain spectrum of a traditional EDFA, the advantage of the SOA is it can amplify signals at this wavelength.

Performance of OEO Signal Detection

Figure 7:
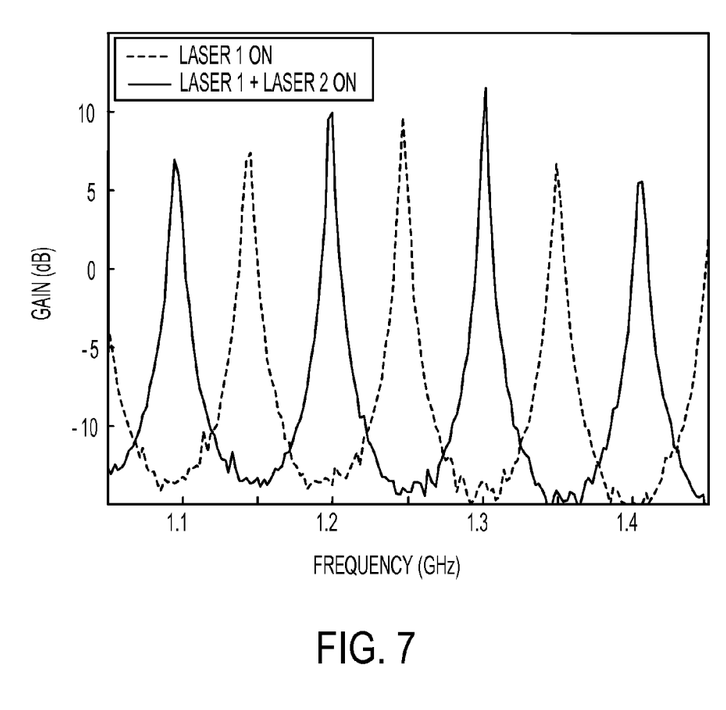
FIG. 7 is a graph showing OEO gain for the cavity modes for the OEO of FIG. 6A with only laser 1 operating or both laser 1 and laser 2 on as measured by the network analyzer.

With the two lasers' wavelengths and the MZM set to the correct operating point, the performance of the OEO system of FIG. 6A can be quantified. Beginning with the selective gain of the OEO, a network analyzer is connected to the RF injected signal port and the RF output of the MZM and swept over four cavity modes. As seen in FIG. 3, with only one laser on, the gain of a CW signal is as high as 10 dB while the loss is as much as −15 dB. With both lasers on, the complementary modes give gain to the incoming signal. In this case, the largest gain is 11 dB with the loss off-mode again at −15 dB. Another metric of interest is the gain bandwidth of the modes in the OEO. Again looking at FIG. 7, we measured the bandwidth where the gain is greater than zero to be 11 MHz for both the one and two laser case (the one laser result is the one showing a peak frequency at 1.25 GHz, the two laser result being the other one with a peak at 1.3 GHz).

Figure 8:
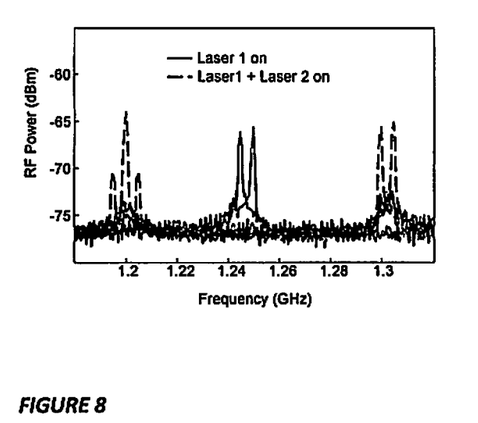
FIG. 8 is a graph showing RF spectrum of OEO cavity modes for the OEO of FIG. 6A with either laser 1 on or both laser 1 and laser 2 on along with an injected CW RF signal whose frequency is swept over the three modes.

FIG. 8 focuses on the modes around 1.25 GHz. The two cavity modes when both lasers are used in the MM-OEO are shown in dashed black. The mode spacing is ~100 MHz and the noise of the non-oscillating mode is about 5 dB higher than the system noise floor. The cavity mode for the single laser system is shown as the solid line. The cavity mode appears in frequency between the two modes of the dual laser configuration. While not shown it also has a measured mode spacing of ~100 MHz. A low power injected CW RF signal is frequency swept over the three modes and the output of the MM-OEO is shown. When the signal is within the cavity mode gain it is amplified and when the signal is outside the mode it drops below the noise floor. For example, the CW RF signal at 1.2 GHz, which sees gain with both lasers on (dashed line), now sees loss and is at the floor of the system in the single laser case (solid line). Conversely, when the CW RF signal is at 1.25 GHz, it sees gain in the single laser case while it is in the noise floor when both lasers are on. Thus by switching on the second laser, the MM-OEO is now sensitive to a different set of frequencies than in the single laser case. The 100 MHz spacing between modes is a 20 times increase in mode spacing when compared to some other prior art systems.

Figure 9:
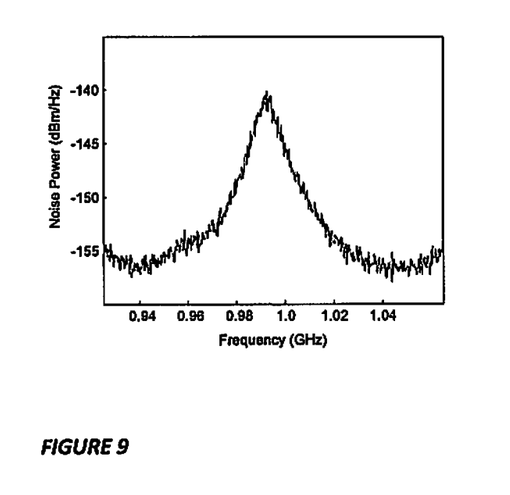
FIG. 9 is a graph showing the noise power normalized to 1 Hz bandwidth of a single cavity mode and surrounding noise floor in a 140 MHz span for the OEO of FIG. 6A.

Since the ESA's noise floor limits the measurement to −76 dBm, the noise floor of the system can be measured by placing a low noise RF amplifier (LNA) after the RF output and a 50 ohm load at the RF input of the MM-OEO cavity. A single cavity mode noise power, measured around 1 GHz with a span of 140 MHz, is shown in FIG. 9. The total integrated measured noise power (Nmeas) over the 140 MHz bandwidth is 68.4 dBm. We define the input sensitivity of the system as the minimum detectable signal with an SNR of 0 dB, $$\text{InputSens(dBm)} = N_{th}(\text{dBm}) + NF_{RF}(\text{dB}) + 10 \log_{10}(BW(\text{Hz})) \quad (1)$$

with thermal noise (Nth) of −174 dBm and RF noise figure (NF$_{RF}$) defined below $$NF_{RF}(\text{dB}) = N_{meas}(\text{dBm}) - N_{th}(\text{dBm}) - G_{RF}(\text{dB}) - 10 \log_{10}(BW(\text{Hz})) \quad (2)$$

Substituting Eqn. 2 into Eqn. 1 yields the following $$\text{InputSens(dBm)} = N_{meas}(\text{dBm}) - G_{RF}(\text{dB}) \quad (3)$$

With the measured CW OEO gain of 10 dB, the input sensitivity is 78.4 dBm. Compared to thermal noise in a 140 MHz bandwidth (92.6 dBm), the system's input sensitivity is only 14.2 dB higher than the thermal limit. By normalizing the noise data into RIN, the lowest level the noise is only 4 dB above the shot noise limit and 16 dB above shot noise where the gain of the mode is zero. Since we are using a laser whose RIN is below the shot noise limit, the extra noise originates from the SOA.

Referring again to FIG. 6A, optionally MM-OEO 10 includes a second, optical output of the MZM 34 as an additional optical output 36 of the OEO cavity that is input to an optional tunable optical filter 38 to produce a second, optical output signal (which can be connected to a second ESA to assess its performance as discussed above).

While specific embodiments of the present invention have been shown and described, it should be understood that other modifications, substitutions and alternatives are apparent to one of ordinary skill in the art. Such modifications, substitutions and alternatives can be made without departing from the spirit and scope of the invention, which should be determined from the appended claims.

What is claimed as new and desired to be protected by Letters Patent of the United States is:

1. A multi-mode optoelectronic oscillator (MM-OEO), comprising:
    an OEO cavity having an input for receiving an RF signal and an RF output, said OEO cavity comprising:
        a first laser having a first laser output;
        a second laser having a second laser output;
        a modulator having a first input coupled to the first laser output, a second input coupled to the second laser output, a third input, and having a first modulator output and a second modulator output;
        a semiconductor optical amplifier (SOA) having an input coupled to the first modulator output and having an SOA amplified output;
        a photodetector coupled to the SOA amplified output and having an output; and
        a coupler having an input coupled to the photodetector output and having a first output coupled to the third modulator input and a second output, whereby an amplified RF signal is produced at the OEO RF output.

2. The MM-OEO of claim 1, wherein the modulator is a Mach-Zehnder modulator.

3. The MM-OEO of claim 1, wherein the OEO further comprises an optical output.

4. The MM-OEO of claim 3, further comprising an optical filter coupled to the OEO optical output.

5. The MM-OEO of claim 4, wherein the optical filter is tunable.

6. The MM-OEO of claim 1, wherein the second laser is tunable.

7. The MM-OEO of claim 1, wherein the second laser has a fixed wavelength.

8. The MM-OEO of claim 1, further comprising an OEO cavity optical output and a tunable optical filter coupled to the OEO cavity optical output for producing a second, tunable optical output signal.

9. A method for detecting unknown low power RF signals, comprising:
    providing a first laser output;
    providing a second laser output;
    modulating the first laser output and the second laser output to generate a modulated output;
    amplifying the modulated output;
    inputting the modulated output to a photodetector and generating a photodetector output;
    inputting the photodetector output to an OEO cavity at a first input, and wherein said OEO cavity has a second input for receiving the unknown low power RF signal, whereby upon receiving the unknown low power RF signal the OEO amplifies the unknown low power RF signal to produce an amplified RF signal as a modulated, amplified output signal.

10. The method of claim 9, further comprising producing an OEO cavity optical output.

11. The method of claim 10, further comprising inputting the OEO cavity optical output to a tunable optical filter, and producing a second, tunable optical output signal.

12. A multi-mode optoelectronic oscillator (MM-OEO), comprising:
an OEO cavity having an input for receiving an RF signal, an RF output, and an optical output, said OEO cavity comprising:
a first laser having a first laser output;
a second laser having a second laser output;
a modulator having a first input coupled to the first laser output, a second input coupled to the second laser output, a third input, and having a first modulator output and a second modulator output;
a semiconductor optical amplifier (SOA) having an input coupled to the first modulator output and having an SOA amplified output;
a photodetector coupled to the SOA amplified output and having an output;
a coupler having an input coupled to the photodetector output and having a first output coupled to the third modulator input and a second output, whereby an amplified RF signal is produced at the OEO RF output; and
comprising an optical filter coupled to the OEO optical output.

13. The MM-OEO of claim 12, wherein the optical filter is tunable.

14. The MM-OEO of claim 12, wherein the second laser is tunable.

15. The MM-OEO of claim 12, wherein the second laser has a fixed wavelength.

16. The MM-OEO of claim 12, further comprising an OEO cavity optical output and a tunable optical filter coupled to the OEO cavity optical output for producing a second, tunable optical output signal.

* * * * *